United States Patent
Boven et al.

(10) Patent No.: US 8,915,030 B2
(45) Date of Patent: Dec. 23, 2014

(54) DIRECT MOUNTED PHOTOVOLTAIC DEVICE WITH IMPROVED ADHESION AND METHOD THEREOF

(75) Inventors: Michelle L. Boven, Midland, MI (US); James R. Keenihan, Midland, MI (US); Stan Lickly, Midland, MI (US); Claude Brown, Jr., Saginaw, MI (US); Robert J. Cleereman, Midland, MI (US); Timothy C. Plum, Midland, MI (US)

(73) Assignee: Dow Global Technologies LLC, Midland, MI (US)

( * ) Notice: Subject to any disclaimer, the term of this patent is extended or adjusted under 35 U.S.C. 154(b) by 335 days.

(21) Appl. No.: 12/908,055

(22) Filed: Oct. 20, 2010

(65) Prior Publication Data

US 2011/0094570 A1    Apr. 28, 2011

Related U.S. Application Data

(60) Provisional application No. 61/253,980, filed on Oct. 22, 2009, provisional application No. 61/257,488, filed on Nov. 3, 2009.

(51) Int. Cl.
*E04D 13/18* (2014.01)
*H01L 31/048* (2014.01)

(52) U.S. Cl.
CPC .......... *H01L 31/0483* (2013.01); *Y02B 10/12* (2013.01); *Y02E 10/50* (2013.01); *Y10S 52/13* (2013.01); *Y10S 52/16* (2013.01)
USPC ............... 52/173.3; 52/DIG. 13; 52/DIG. 16; 136/244; 136/257

(58) Field of Classification Search
CPC ...... Y02B 10/12; E04D 1/26; H01L 31/0483; F24J 2/5211
USPC .............. 52/173.3, 173.1, 551, 552; 136/244, 136/251
See application file for complete search history.

(56) References Cited

U.S. PATENT DOCUMENTS

| 2,631,887 A | 3/1953 | Wernig |
| 4,586,301 A | 5/1986 | Hickman |

(Continued)

FOREIGN PATENT DOCUMENTS

| FR | 2 914 785 A1 | 10/2008 |
| JP | H05-003430 U | 1/1993 |

(Continued)

OTHER PUBLICATIONS

3M VHB Tape: <http://solutions.3m.com/innovation/en_US/stories/waves-of-steel>.*

(Continued)

*Primary Examiner* — William Gilbert

(57) ABSTRACT

The present invention is premised upon a photovoltaic device suitable for directly mounting on a structure. The device includes an active portion including a photovoltaic cell assembly having a top surface portion that allows transmission of light energy to a photoactive portion of the photovoltaic device for conversion into electrical energy and a bottom surface having a bottom bonding zone; and an inactive portion immediately adjacent to and connected to the active portion, the inactive portion having a region for receiving a fastener to connect the device to the structure and having on a top surface, a top bonding zone; wherein one of the top and bottom bonding zones comprises a first bonding element and the other comprises a second bonding element, the second bonding element designed to interact with the first bonding element on a vertically overlapped adjacent photovoltaic device to bond the device to such adjacent device or to the structure.

20 Claims, 5 Drawing Sheets

(56) References Cited

U.S. PATENT DOCUMENTS

| | | | |
|---|---|---|---|
| 4,627,207 | A | 12/1986 | Young et al. |
| 4,641,471 | A | 2/1987 | Young et al. |
| 4,641,472 | A | 2/1987 | Young et al. |
| 4,686,808 | A | 8/1987 | Triplett |
| 5,239,802 | A | 8/1993 | Robinson |
| 5,437,735 | A * | 8/1995 | Younan et al. ............... 136/251 |
| 5,950,387 | A * | 9/1999 | Stahl et al. .................... 52/559 |
| 6,148,570 | A | 11/2000 | Dinwoodie et al. |
| 6,247,289 | B1 | 6/2001 | Karpinia |
| 6,397,556 | B1 * | 6/2002 | Karpinia ..................... 52/748.1 |
| 6,470,642 | B1 * | 10/2002 | Eads ............................. 52/518 |
| 6,500,516 | B2 * | 12/2002 | Bourlier et al. ............... 428/116 |
| 6,725,623 | B1 | 4/2004 | Riddell et al. |
| 6,758,019 | B2 * | 7/2004 | Kalkanoglu et al. ........... 52/553 |
| 6,845,592 | B2 | 1/2005 | Voegele |
| 6,968,662 | B2 * | 11/2005 | Rodrigues ...................... 52/518 |
| RE38,988 | E | 2/2006 | Dinwoodie |
| 7,118,794 | B2 * | 10/2006 | Kalkanoglu et al. ......... 428/143 |
| 7,178,295 | B2 | 2/2007 | Dinwoodie |
| 7,204,063 | B2 * | 4/2007 | Kandalgaonkar ............... 52/551 |
| 7,299,598 | B2 | 11/2007 | Gembala et al. |
| 7,328,534 | B2 * | 2/2008 | Dinwoodie ................... 52/173.3 |
| 7,578,108 | B2 * | 8/2009 | Swanson .......................... 52/540 |
| 2002/0066235 | A1 | 6/2002 | Stearns et al. |
| 2003/0070391 | A1 * | 4/2003 | Tachauer et al. ........... 52/745.21 |
| 2003/0154680 | A1 | 8/2003 | Dinwoodie |
| 2003/0188500 | A1 | 10/2003 | Voegele |
| 2004/0083673 | A1 | 5/2004 | Kalkanoglu et al. |
| 2004/0206035 | A1 | 10/2004 | Kandalgaonkar |
| 2004/0216405 | A1 | 11/2004 | Gembala et al. |
| 2005/0229924 | A1 | 10/2005 | Luconi et al. |
| 2007/0193135 | A1 | 8/2007 | VandenBerg |
| 2007/0220823 | A1 * | 9/2007 | Akins et al. ...................... 52/409 |
| 2007/0295391 | A1 | 12/2007 | Lenox et al. |
| 2008/0000173 | A1 | 1/2008 | Lenox et al. |
| 2008/0083169 | A1 | 4/2008 | Sicurella |
| 2008/0196231 | A1 | 8/2008 | Grove |
| 2008/0196358 | A1 | 8/2008 | Schafer-Roth |
| 2008/0245399 | A1 | 10/2008 | DeLiddo |
| 2008/0245404 | A1 | 10/2008 | DeLiddo |
| 2009/0000220 | A1 | 1/2009 | Lenox |
| 2009/0044850 | A1 * | 2/2009 | Kimberley ..................... 136/244 |
| 2009/0178350 | A1 * | 7/2009 | Kalkanoglu et al. ......... 52/173.3 |
| 2009/0223550 | A1 * | 9/2009 | Curtin et al. .................. 136/244 |
| 2010/0180523 | A1 | 7/2010 | Lena et al. |

FOREIGN PATENT DOCUMENTS

| | | |
|---|---|---|
| JP | 2001-279871 A | 10/2001 |
| JP | 2003-147913 A | 5/2003 |
| JP | 2003-179246 A | 6/2003 |
| JP | 2007-243166 A | 9/2007 |
| WO | 00/30184 A1 | 5/2000 |
| WO | 03071047 A2 | 8/2003 |
| WO | 2007/035677 A2 | 3/2007 |
| WO | 20070123927 A2 | 11/2007 |
| WO | 2008-063660 A | 5/2008 |
| WO | 2007079382 A2 | 7/2009 |

OTHER PUBLICATIONS

Search Report dated Feb. 21, 2011, International Application No. PCT/US2010/053642.

Witten Opinion dated Nov. 11 2011, for corresponding PCT Application US2010/053642 filed Oct. 22, 2010.

Written Opinion dated Nov. 11, 2011; for corresponding PCT Application US2010/053642 filed Oct. 22, 2010.

Japanese Office action dated Sep. 3, 2013: Application No. 2012-535395.

* cited by examiner

DIRECT MOUNTED PHOTOVOLTAIC DEVICE WITH IMPROVED ADHESION AND METHOD THEREOF

This invention was made with U.S. Government support under contract DE-FC36-07G017054 awarded by the Department of Energy. The U.S. Government has certain rights in this invention.

CLAIM OF PRIORITY

This application is a non-provisional of provisional application No. 61/253,980, filed Oct. 22, 2009 and provisional application No. 61/257,488 filed Nov. 3, 2009. This application is also co-pending with PCT Application No.: PCT/US2010/053642 filed Oct. 22, 2010.

FIELD OF THE INVENTION

The present invention relates to a photovoltaic device and method thereof that is directly mounted to a structure, more particularly a photovoltaic shingle and method thereof adapted to be directly mounted to a building structure such as a roof deck or wall.

BACKGROUND

Efforts to improve the state of the art in the area of solar power generation; particularly in the area of building mounted generation has been receiving ever increasing industry focus over the last few years. A subset of building mounted generation is building-integrated photovoltaics (BIPV), where the photovoltaic elements are integral parts of the building (such as providing exterior weather skin as in shingles or siding. Of particular importance is the goal of providing a reliable and durable solar power generation system that provides the most kilowatt hours (KwH) for the least amount of cost. Some of the issues associated with reaching this goal concern the ability of the generation system to be easy to assemble and install, have a relatively high KwH output, and be durable (e.g. hold up over time given the likely environmental conditions such as relatively high winds and rain). One particular issue related to durability is that of wind loading, such as determined via (Underwriters Laboratories) UL 1897, Tests for Uplift Resistance of Roof Assemblies. That Is the ability of the system to not be damaged when subjected to winds, for example, in excess of 100 miles per hour or more. One particular issue related to installation ease is the need to keep the BIPV from becoming active (e.g. producing electricity) before it is wanted. Other potential issues relates to the inherently low coefficient of friction of BIPVs (e.g. being slippery) and the ease of installers to walk on the surface of the system, and potential packaging and shipping issues.

The current state of the art building mounted solar power generation systems take many forms, but can generally be characterized as either solar panels that are mounted to elaborate mounting structures (e.g. inside box frames, platform risers, for example: SunPower Model 31® by SunPower® of San Jose, Calif., USA) creating a solar power generation assembly with a cross sectional thickness (e.g. 25 mm or more) and a high stiffness (e.g. about 70000 MPa "MegaPascal", Modulus of elasticity) or flexible laminate structures (e.g. rolled solar laminates offered by Uni-Solar® of Rochester Hills, Mich., USA) which are similar in cross sectional area thickness (e.g. about 1.5 to 7 mm) and stiffness (e.g. about 5 to 50 MPa) to typical asphalt roofing shingles. Of note, it is believed that traditional cedar shake type roofing shingles are typically about 1 to 5 times thicker than typical asphalt roofing shingles and have a stiffness of about 4000 to 9000 MPa, but do not suffer from wind uplift issues. It is not surprising that the SunPower type system does not suffer from wind uplift issues (e.g. due to the elaborate mounting structures and/or the high stiffness). It is also not surprising that the Uni-Solar type system can weather the wind uplift issue because the entire laminate is adhesively bonded to the building structure.

It is believed that the above issue of wind loading may also be affected by variations in device cant (e.g. in the installed position) as well as variations in mounting surface height/flatness.

Among the literature that may pertain to this technology include the following patent documents: US Patent Publications: 20090000220; 20080245404; 20080245399; 20080196358; 20080196231; 20080083169; 20080000173; 20070295391; 20070193135; 20050229924; 20040216405; 20040206035; 20040083673; 20030188500; 20030154680; 20020066235; U.S. Pat. Nos. 7,299,598; 7,204,063; 7,178,295; 7,118,794; 6,845,592; 6,758,019; 6,725,623; 6,397,556; 6,247,289; 6,148,570; 5,950,387; 5,239,802; 4,686,808; 4,641,472; 4,641,471; 4,627,207; 4,586,301; 2,631,887; RE38988; and PCT Publications: WO2007123927A2; WO2007079382A2; WO2003071047A2, all incorporated herein by reference for all purposes.

SUMMARY OF THE INVENTION

The present invention is directed to a photovoltaic device and method thereof that is directly mounted to a structure (e.g. building structure, wall and/or roof deck). The invention is addressing one or more of the issues/problems discussed above.

Moreover, the present invention relates to a new kind of building mounted solar power generation systems. This new system is a plurality of individual "shingle-like" structures mounted to a building structure with fasteners (e.g. nails, screws, or the like) and has a high stiffness (e.g. about up to about 10000 MPa) and a thickness of about 15 mm. Surprisingly, given the relatively high stiffness/thickness of the system (e.g. similar to cedar shakes), it may require the improvements disclosed herein to achieve the goals discussed above.

Accordingly, pursuant to one aspect of the present invention, there is contemplated a photovoltaic device suitable for directly mounting on a structure, the device including: an active portion including a photovoltaic cell assembly having a top surface portion that allows transmission of light energy to a photoactive portion of the photovoltaic device for conversion into electrical energy and a bottom surface having a bottom bonding zone; and an inactive portion immediately adjacent to and connected to the active portion, the inactive portion having a region for receiving a fastener to connect the device to the structure and having on a top surface, a top bonding zone; wherein one of the top and bottom bonding zones comprises a first bonding element and the other comprises a second bonding element, the second bonding element designed to interact with the first bonding element on a vertically overlapped adjacent photovoltaic device to bond the device to such adjacent device or to the structure.

The invention may be further characterized by one or any combination of the features described herein, such as: the first bonding element comprises an adhesive creating an adhesive bonding element and the second bonding element includes a compatible material for accepting at least a portion of the first bonding element; the first bonding element is coextensive with or disposed with 25 mm of a peripheral edge of the active portion on the bottom surface of the active portion; the second bonding element includes at least one recessed pocket for accepting at least a portion of the first bonding element; the at least one recessed pocket has a pocket depth of at least 1.0 mm; the first bonding element further comprises a removable release liner disposed over an outer surface of the adhesive, which is removed to enable the first and second bonding elements or the first bonding element and the structure to form a bond; the removable release liner extends laterally from a periphery of the photovoltaic device by at least 10 mm creating a laterally extended portion, and is folded back upon itself at least in one of the bonding zones; the removable release liner covers a portion of the top surface portion of the active portion and is not transparent (e.g. opaque) or light limiting to prevent the cell from generating electricity until it is removed; the removable release liner includes a print installation instruction for easy access for installer; the removable release liner includes an outer surface with a slip protection; the bonding element comprises a pressure sensitive adhesive that maintains a minimum peel force of 3 PLI (pounds per linear inch), more preferably 5 PLI, and most preferred 10 PLI per ASTM D 903-98 at temperatures between −40° C. and 85° C. and have an elongation of >500%, more preferably >1000% per ASTM D 412-06; a portion of the top bonding zone, the bottom bonding zone, or both include a patterned surface that increases the surface area relative to a flat surface by more than 5%; the first and second bonding elements comprises a hook and loop fastener assembly with an assembly thickness and the hook and loop fastener assembly thickness is at least 90% disposed within the at least one recessed pocket; the first bonding element, the second bonding element, or both are configured as either as a continuous element or a non-continuous element separated by a space; the device has an increased thickness of the inactive portion at or near the edge opposite from the action portion.

Accordingly, pursuant to another aspect of the present invention, there is contemplated a method of assembling at least two photovoltaic devices on a structure, can include the steps of: a. providing the at least two photovoltaic devices, the devices including: a removable release liner, an active portion including a photovoltaic cell assembly having a top surface portion that allows transmission of light energy to the photoactive portion for conversion into electrical energy and a bottom surface having a bottom bonding zone, and an inactive portion immediately adjacent to and connected to the active portion, the inactive portion having a region for receiving a fastener to connect the device to the structure and having on a top surface a top bonding zone; b. providing a plurality of mechanical fasteners; c. placing the one of the at least two photovoltaic devices on the structure; d. securing the placed photovoltaic device to the structure with at least two of the plurality of mechanical fasteners; e. placing the second of the at least two photovoltaic devices partially on the structure and partially on top of the photovoltaic device of step c; f. securing the second placed photovoltaic device to the structure with at least two of the plurality of mechanical fasteners; and g. pressing down on a portion of the top surface portion of the second placed photovoltaic device, completing the assembling of the at least two photovoltaic devices on the structure.

The invention may be further characterized by one or any combination of the features described herein, such as: the at least two photovoltaic devices include a removable release liner, wherein the release liner covers the at least one of the bonding zones, extends laterally from a periphery of the photovoltaic device by at least 10 mm creating a laterally extended portion, and is folded back upon itself at least in one of the bonding zones; including the steps of removing the removable release liner by pulling on the laterally extended portion prior to the pressing down step; the removable release liner covers a portion of the top surface portion of the active portion and is not transparent or light limiting to prevent the cell from generating electricity until it is removed; the removable release liner includes a print installation instruction for easy access for an installer; the removable release liner includes an outer surface with a slip protection.

It should be appreciated that the above referenced aspects and examples are non-limiting, as others exist within the present invention, as shown and described herein.

DETAILED DESCRIPTION OF THE PREFERRED EMBODIMENT

Figure 1:
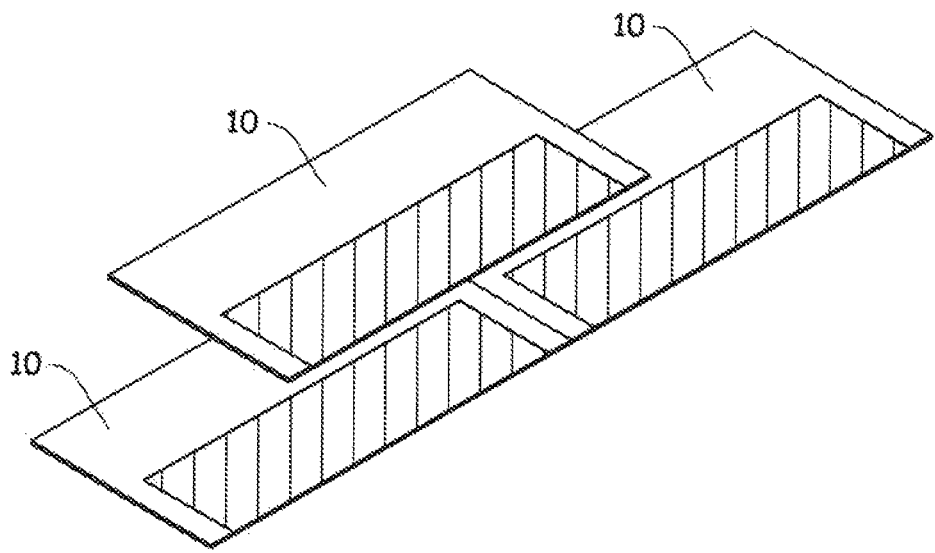
FIG. 1 is a top perspective view of an illustrative group of photovoltaic devices as assembled.

The present invention is directed to a photovoltaic assembly system for securing and/or aligning at least a plurality of vertically adjacent (overlapping) photovoltaic device assemblies 10 (or overlapping photovoltaic device arrays) to one another. The devices 10 are preferably directly mounted to a structure (e.g. building structure, wall and/or roof deck). The present invention seeks to overcome the issue of wind uplift in with a unique interlocking solution and optionally taking advantage of that solution to address some of the other potential issues discussed above. FIG. 1 illustrates three photovoltaic devices 10 in an assembled arrangement (e.g. a lower photovoltaic device array consisting of two horizontally adjacent devices 10 and an overlapping upper photovoltaic device array consisting of one device 10).

Photovoltaic Device

In general, the photovoltaic device 10 contemplated by the present invention is similar in construction to that disclosed in the PCT application PCT/US09/42496 which claims priority to U.S. Provisional Application 61/050,341; both of which are incorporated by reference for all purposes. The device can broadly be described as an assembly of a multi-layered laminate (with polymeric and non-polymeric layers) which is encapsulated on at least three sides by a polymeric casing. The device 10 is preferably adapted to mount directly to a structure, such as a building roof deck (with or without other items such as roofing felt or a previous layer of asphalt shingles), without the need for intermediate holding structures (e.g. frames, rails, risers, or the like). In broad terms, the device 10 is intended to be installed on a building (e.g. roof) in a similar fashion as standard asphalt shingles. In a preferred embodiment, the device 10 is rectangular in shape, with a generally flat profile and with a thickness of less than about 20 mm, more preferably less than about 15 mm and generally more than about 2 mm, more preferably more than about 5 mm. It is contemplated that other shapes (square, round, polygon, etc. . . . I), other profiles (e.g. curved, stepped, etc. . . . ), and thicknesses (greater than about 15 mm) are also possible.

Figure 2:
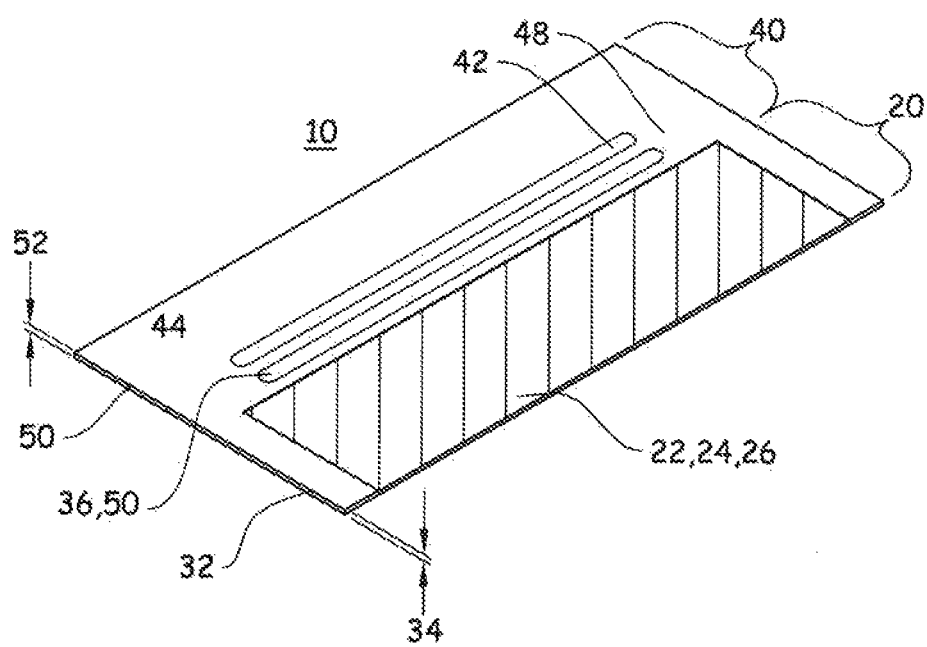
FIG. 2 is a top perspective view of a single photovoltaic device of FIG. 1.
Figure 3:
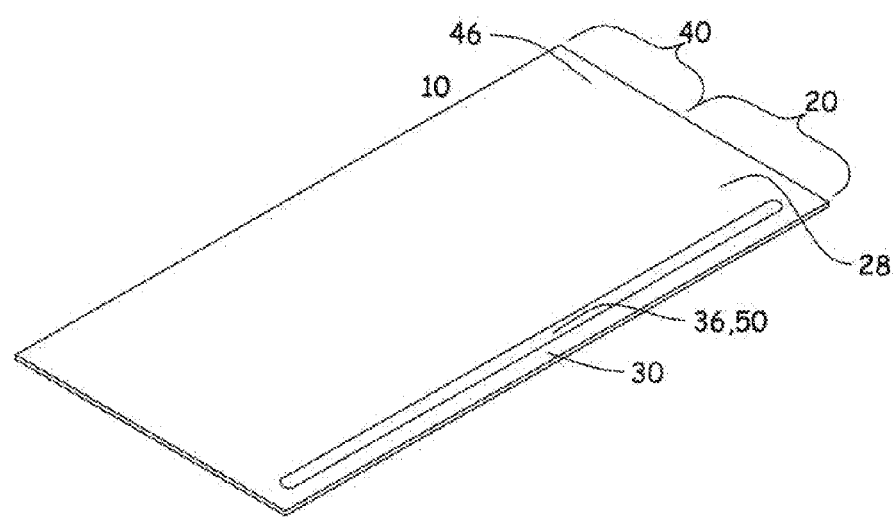
FIG. 3 is a bottom perspective view of a single photovoltaic device of FIG. 1.

The photovoltaic device 10 may be further defined, as illustrated in FIGS. 2 and 3, as a device 10 with an active portion 20 and an inactive portion 40 immediately adjacent to and connected to the active portion 20.

The active portion 20 may include a photovoltaic cell assembly 22 having a top surface portion 24 that allows transmission of light energy to a photoactive portion 26 of the photovoltaic device 10 for conversion into electrical energy. It also has a bottom surface portion 28 having a bottom bonding zone 30. It has a peripheral edge 32 and a thickness 34.

The inactive portion 40 may include a region 42 for receiving a fastener (e.g. screw, nail, or other mechanical fasteners, not shown), the fastener adapted to connect the device 10 to a structure (e.g. a roof deck or wall). The inactive portion may also be defined as a top surface portion 44, a bottom surface portion 46 and a top bonding zone 48. It has a peripheral edge 50 and a thickness 52. The inactive portion 40 may also include a connection means, such as an electrical connector housing (not shown), that functions to string multiple devices 10 together.

The top bonding zone 48 and the bottom bonding zone 30 may be further defined to include a first bonding element 36 and the other comprises a second bonding element 50. Functionally, the bonding elements 36, 50 may be designed to interact with each other when the device 10 is vertically overlapped with an adjacent photovoltaic device 10. One of these bonding elements may also bond the device 10 to the structure if there is no device immediately below it.

Optionally, the bonding zones 30, 48 may include a patterned surface that increases the surface area relative to a flat surface by more than 5%, more preferably by more than 15%, and most preferably by more than 25%. It is contemplated that there may also be the incorporation of structures (not shown) that have a vertical component (e.g. protrusions from the surfaces 28 and/or 44), for example to introduce a required shear component to the failure of the adhesive. Also contemplated is the addition of an open mesh structure for preventing a tortuous patch type of failure.

In one preferred embodiment, the top surface portion 44 of the inactive portion is may include polyethylene, polypropylene, thermoplastic polyolefins, olefin block copolymers, thermoplastic urethanes, silicones, and many other polymers with and without fillers, including particularly glass fillers.

In one preferred embodiment, the bottom surface portion 28 of the active portion 20 may include thermoplastic polyolefin ("TPO"), thermoplastic elastomer, olefin block copolymers ("OBC"), natural rubbers, synthetic rubbers, polyvinyl chloride, and other elastomeric and plastomeric materials, polyolefins, polyester amides, polysulfone, acetel, acrylic, polyvinyl chloride, nylon, polycarbonate, phenolic, polyetheretherketone, polyethylene terephthalate, epoxies, including glass and mineral filled composites or any combination thereof.

Recessed Pocket(s)

Figure 4:
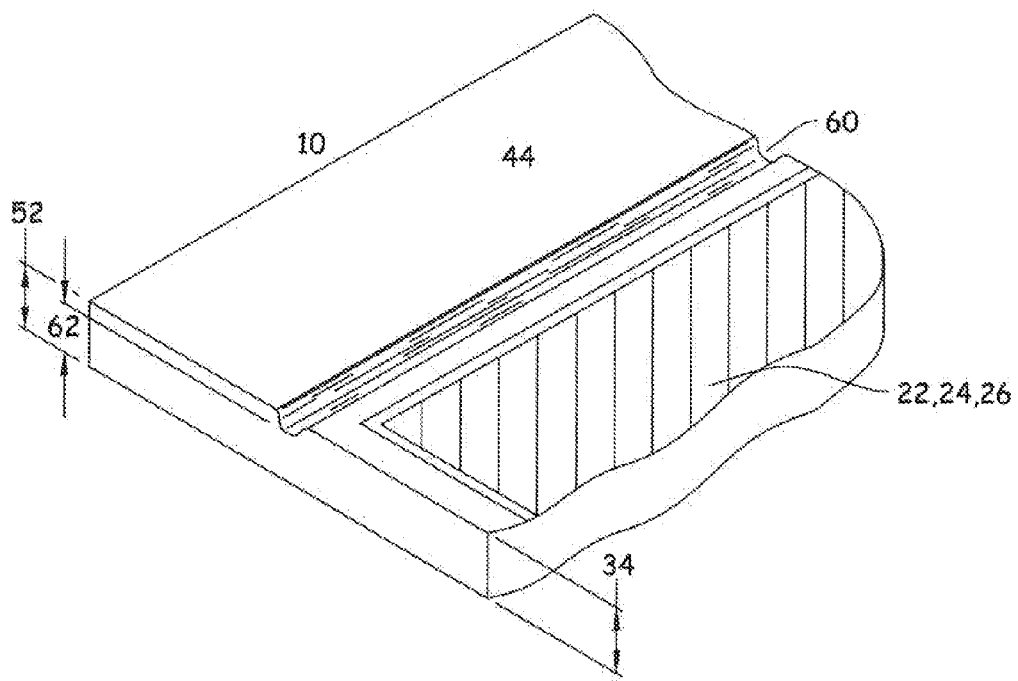
FIG. 4 is a top perspective view of a portion of single photovoltaic device with an exemplary pocket.
Figure 5A:
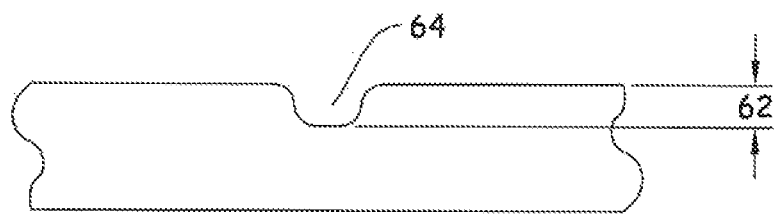
FIGS. 5A-E are side views of exemplary pocket profile sections.
Figure 5B:
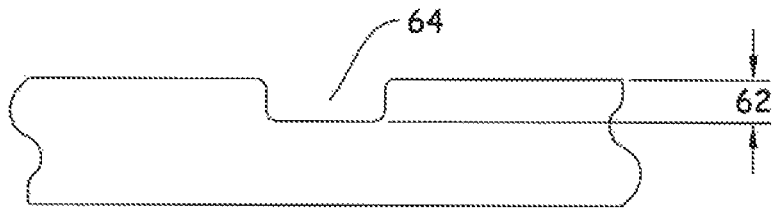
Figure 5C:
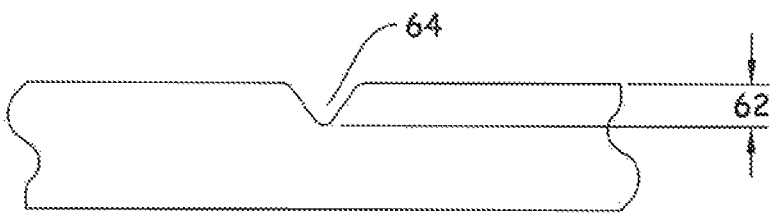
Figure 5D:
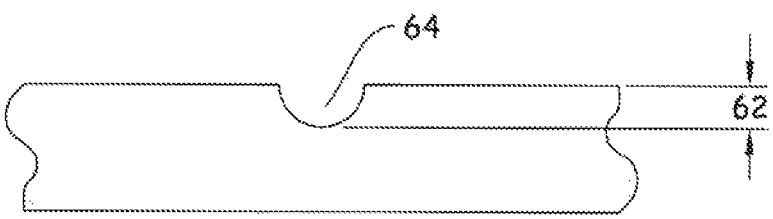
Figure 5E:
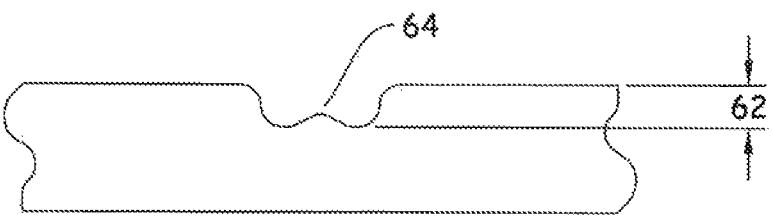

It is contemplated that the device 10 may also include at least one recessed pocket 60, see FIG. 4. This pocket 60 may be disposed on the top or bottom surface portions 28, 46 or on the top surfaces 24, 44 and generally has a depth less than the thicknesses 34, 52. In one preferred embodiment, the pocket 60 has a pocket depth 62 of at least about 1.0 mm. The pocket may span the device (e.g. side to side) as a contiguous pocket or in segments of non-contiguous pockets (e.g. a plurality of pockets 60). The pocket(s) may be any number of shapes (e.g. square, rectangular, trapezoidal, circular, etc. . . . ) and have varied number of pocket profiles 64 (e.g. concave, square, triangular, circular, or any combination thereof), as illustrated in FIGS. 5A-E. Preferably, the pocket(s) 60 have a geometric shape and profile adapted to accept either or both bonding elements 36, 50.

Bonding Elements

Bonding elements 36, 50 generally function as the means for connecting (bonding) two at least partially vertically adjoining devices 10 to one another or in the case of the "bottom" device 10, to the structure. It is contemplated that the bonding elements 36, 50 could be an adhesive, a hook and loop fastener assembly, or an adjoining surface (e.g. when an adhesive is only present on one side of the joint before assembly, the second element 50 is the adjoining surface). Positionally, it is preferred that at least one of the bonding elements be located at or near the peripheral edge of one of the devices 10, although it is contemplated that the bonding elements could be nearer the center of the device 10. In one preferred embodiment, the first bonding element 36 is coextensive with or disposed within about 25 mm of the peripheral edge of the active portion on the bottom surface portion 28 of the active portion 20. For clarification purposes, the terms "disposed" refers to a location of an element and "connectively disposed" refers to the location and that the elements are in contact with each other.

In the case of an adhesive bonding element, it is contemplated that the adhesive chosen is at least partially compatible with the surfaces being bonded (e.g. the polymeric surfaces of the devices 10 or the structure). In general, it is preferred that the bonding element comprises a adhesive that maintains a minimum peel force of about 3 PLI (pounds per linear inch), more preferably about 5 PLI, and most preferred about 10 PLI or more, per ASTM D 903-98 at temperatures between −40° C. and 85° C. and have an elongation of about >500%, more preferably >about 1000% per ASTM D 412-06. It is also preferred if the adhesive maintains a thickness (after assembly) of about 0.5 mm or more, more preferably from about 0.7 mm to about 2.0 mm.

In one preferred embodiment, the adhesive bonding element is comprised of a pressure sensitive adhesive (PSA) or a contact adhesive), that bonds to surfaces on contact (no curing time required) and to the respective surfaces, (e.g. adjoining device 10, or structure or an asphalt shingle) with very slight pressure. They may be available in solvent and latex or water based forms. It is believed that pressure sensitive adhesives and contact adhesives are often based on non-crosslinked rubber adhesives, acrylics or polyurethanes. It is also believed that pressure sensitive adhesives form viscoelastic bonds that are aggressively and permanently tacky; adhere without the need of more than a finger or hand pressure; and require no activation by water, solvent or heat.

Pressure sensitive adhesives and contact adhesives may be available in a wide variety of chemical compositions or systems. Some contemplated PSAs include acrylic and methacrylate adhesives, rubber-based pressure sensitive adhesives, styrene copolymers (SIS/SBS), and silicones. Acrylic adhesives are known for excellent environmental resistance and fast-setting time when compared with other resin systems. Acrylic pressure sensitive adhesives often use an acrylate system. Ethylene ethyl acrylate (EEA) or ethylene methyl acrylate (EMA) copolymers are used to form hot melt PSA adhesives. Natural rubber, synthetic rubber or elastomer sealants and adhesives can be based on a variety of systems such silicone, polyurethane, chloroprene, butyl, polybutadiene, isoprene or neoprene. In a preferred embodiment, the PSA include Ethylene Propylene Copolymer Tape, rubber based adhesives, synthetic rubber-based tape, PE foam tape, and acrylic based and or combination of the above in multi layer construction, e.g., Acrylic/PET/Acrylic. The most preferred adhesive being a butyl adhesive tape. It is contemplated that some important characteristics of the adhesive include adhesives with instant aggressive adhesion/tack to the roofing structure without the use of secondary materials such as primers, yet also has and retains high strength at and after weather extremes (such as elevated temperatures, e.g., 85° C., for prolonged periods, and provides watertight attachment of components to roofing structure. Some examples of commercially available (and trademarked) adhesives may include: Butyl: Ashland Plioseal Seam tape, Adco PVA series (e.g., PVA 600BT and 650BT); Rubber based: Adco SP-505 Cured Roofing Seam Tape; Synthetic rubber based: MACtac TM1039 and GS series; Ethylene propylene copolymer: SikaLastomer 68; Acrylic/PET/Acrylic: and Tesa Tape 4965 PET reinforced; and PE Foam Tape: Tesa Tape 62932 D/C Foam Tape.

In the case of a hook and loop fastener assembly, a minimum peel force (between the hook and loop) of about 3 PLI (pounds per linear inch), more preferably about 5 PLI, and most preferred of about 10 PLI or more per ASTM D 903-98 or more at temperatures between −40° C. and 85° C. In this case, it is contemplated that the hook and loop fastener assembly is bonded to the device 10 (e.g. via adhesive, heat staked, over molded, ultrasonically welded, or mechanically fastened).

Removable Release Liner

Figure 6:
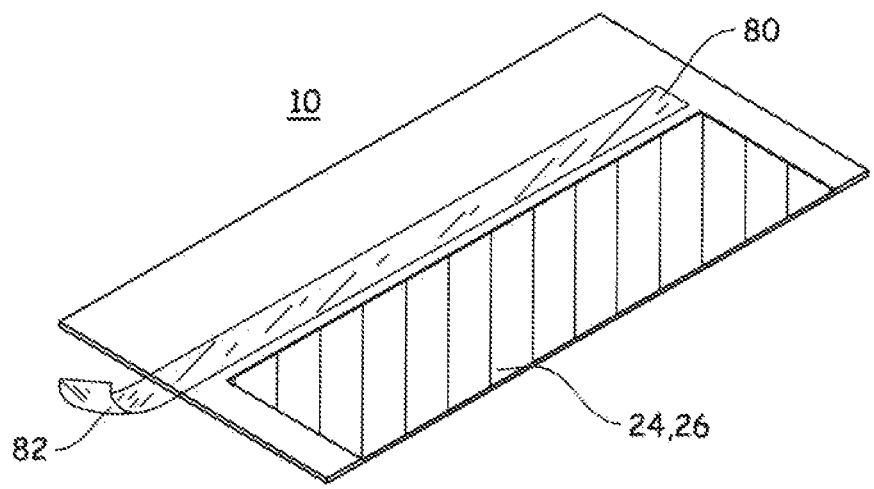
FIG. 6 is a top perspective view of a single photovoltaic device with an exemplary liner strip.
Figure 7:
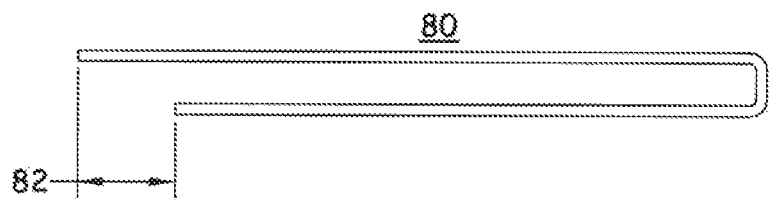
FIG. 7 is a side view of the exemplary liner strip of FIG. 6 showing the fold-back.
Figure 8:
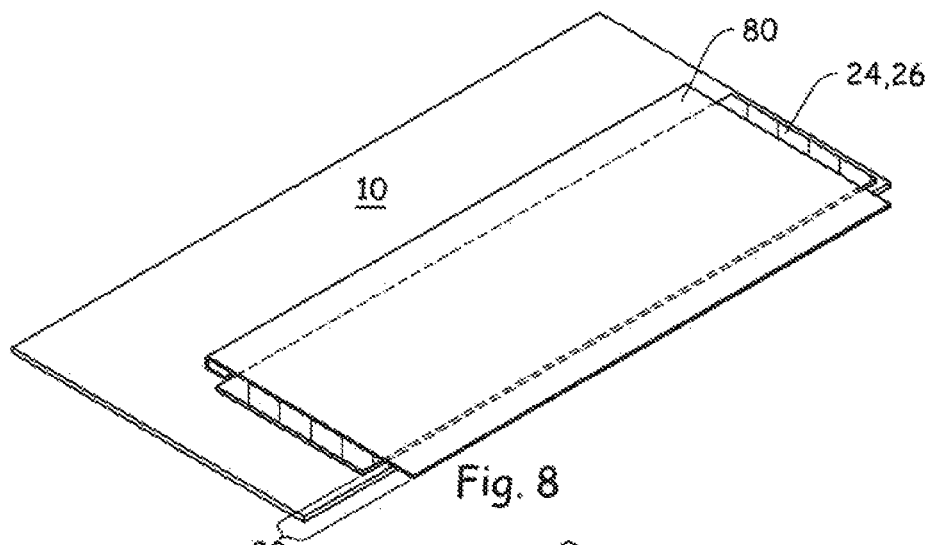
FIG. 8 is a top perspective view of a single photovoltaic device with another exemplary liner strip.

In the case where an adhesive as discussed above is used, there may be a need to include a removable release liner 80, illustrated in FIGS. 6-8. It is contemplated that the removable release liner 80 may be used to aid in shipment and installation, as well as to ease the alignment and placement of the two devices 10 to be bonded together. The liner 80 may also provide additional functionality discussed as optional embodiments below.

It is contemplated that the liner 80 may be constructed of a relatively thin (e.g. less than about 1.0 mm thick) essentially polymeric film. The liner 80 may be a single layer film or may be a multi-layer film with multiple layers of the same or dissimilar materials. Some of the materials contemplated are, a high density poly ethylene (HDPE) and a poly-coated Kraft release paper (liner). It is believed that properties such as thickness and flexibility may be of some importance.

In one preferred embodiment, the removable release liner may be disposed over the outer surface of the adhesive and is removed to enable the first and second bonding elements or the first bonding element and the structure to form a bond.

In another preferred embodiment, the removable release liner 80 extends laterally from the periphery of the photovoltaic device by at least 10 mm creating a laterally extended portion 82. The liner 80 is also folded back upon itself at least in one of the bonding zones. The fold making the peeling off of the liner 80 easier.

In another preferred embodiment, the removable release liner covers a portion of the photoactive portion 26 and is not transparent (e.g. opaque) or light limiting (e.g. at least for desired wavelengths or limiting enough to prevent power generation) to prevent the cell from generating electricity (e.g. any electricity or an amount considered too high for safety of the system or an installer) until it is removed.

Optionally, the removable release liner may also include a print installation instruction (e.g. characters and/or pictographically information) for easy access for installer. Optionally, the removable release liner may also include an outer surface 84 with a slip protection (e.g. texture or high coefficient of friction).

Local Device Geometry

It is contemplated that may be desirous to increase the amount of pressure applied at or near the front edge of the device 10, for example to overcome variations in device cant (e.g. in the installed position) as well as variations in mounting surface height/flatness. One way this may be accomplished by shifting the pressure point and force transmission in the device 10.

One possible way of shifting the pressure point and force transmission may be to increase thickness of the device 10 at or near edge 92. This may be accomplished by local variation in the geometry of the device 10 (e.g. local thickness changes of about 0.5 to 15 mm).

This thickness increase may be provided by making the device thicker by altering the shape of the mold or by separate component/components are added (e.g. prior to or during installation) to the device 10 to locally increase the height of the device 10. It is contemplated that any number of components may serve this purpose; for example, trim strips or clips that may be fastened to the device 10.

Figure 9:
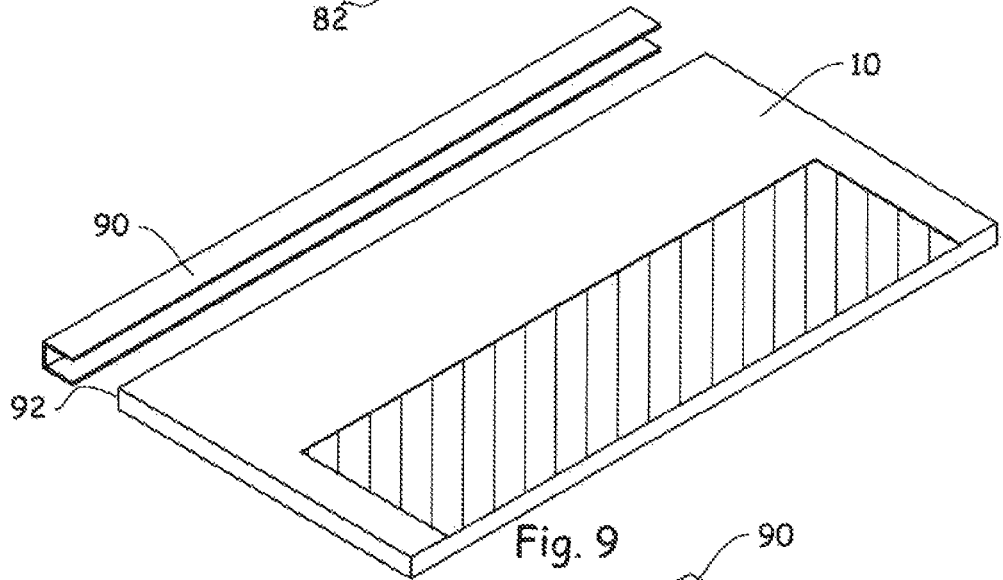
FIG. 9 is a top exploded perspective view of a single photovoltaic device and an exemplary end cap.
Figure 10:
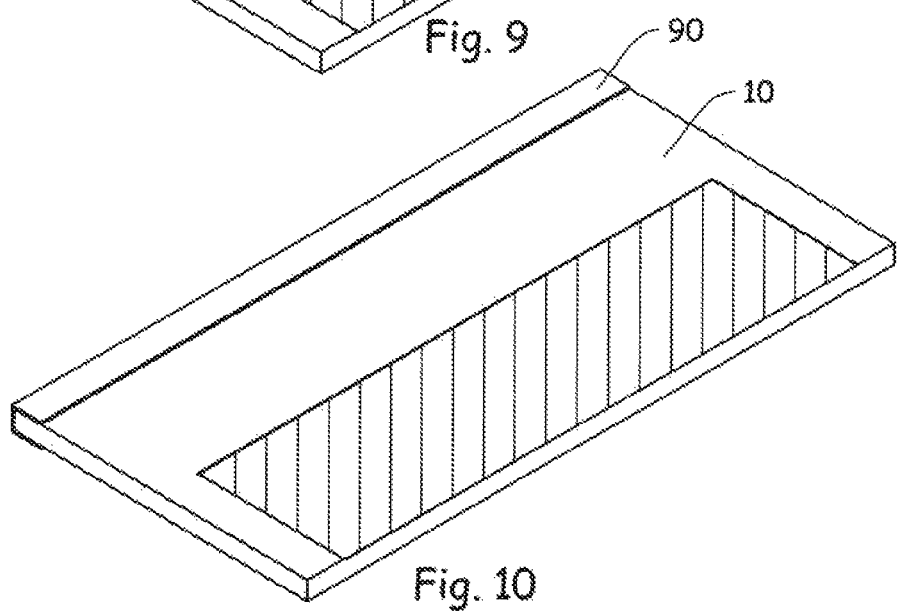
FIG. 10 is a top perspective assembly view of a single photovoltaic device and an exemplary end cap.

One illustrative example, where a single separate component (e.g. end cap 90) is added, is shown in FIGS. 9 and 10. In this example the separate component is a U-shaped channel that fits over one edge of the device. The end cap 90 is disposed over a top edge 92 of the device 10. It is contemplated that it may be desirous to fasten (e.g. nail) the device 10 as close to this location as possible (e.g. within about 25 mm or less) to set the height beneath the fastening region 42 in the device 10.

Method

Also contemplated in the present invention is a method of assembling at least two photovoltaic devices on a structure (the devices 10 as described above). This inventive method may include the steps of: a. providing the at least two photovoltaic devices, the devices including: a removable release liner, an active portion including a photovoltaic cell assembly having a top surface portion that allows transmission of light energy to the photoactive portion for conversion into electrical energy and a bottom surface having a bottom bonding zone; and an inactive portion immediately adjacent to and connected to the active portion, the inactive portion having a region for receiving a fastener to connect the device to the structure and having on a top surface a top bonding zone; b. providing a plurality of mechanical fasteners; c. placing the one of the at least two photovoltaic devices on the structure; d. securing the placed photovoltaic device to the structure with at least two of the plurality of mechanical fasteners; e. placing the second of the at least two photovoltaic devices partially on the structure and partially on top of the photovoltaic device of step c; f. securing the second placed photovoltaic device to the structure with at least two of the plurality of mechanical fasteners; and g. pressing down on a portion of the top surface portion of the second placed photovoltaic device, completing the assembling of the at least two photovoltaic devices on the structure.

Optionally, the method may also include: the at least two photovoltaic devices include a removable release liner, wherein the release liner covers the at least one of the bonding zones, extends laterally from a periphery of the photovoltaic device by at least 10 mm creating a laterally extended portion, and is folded back upon itself at least in one of the bonding zones; the steps of removing the removable release liner by pulling on the laterally extended portion prior to the pressing down step; the removable release liner covers a portion of the top surface portion of the active portion and is non transparent or light limiting to prevent the cell from generating electricity until it is removed; the removable release liner includes a print installation instruction for easy access for installer; the removable release liner includes an outer surface with a slip protection.

Unless stated otherwise, dimensions and geometries of the various structures depicted herein are not intended to be restrictive of the invention, and other dimensions or geometries are possible. Plural structural components can be provided by a single integrated structure. Alternatively, a single integrated structure might be divided into separate plural components. In addition, while a feature of the present invention may have been described in the context of only one of the illustrated embodiments, such feature may be combined with one or more other features of other embodiments, for any given application. It will also be appreciated from the above that the fabrication of the unique structures herein and the operation thereof also constitute methods in accordance with the present invention.

The preferred embodiment of the present invention has been disclosed. A person of ordinary skill in the art would realize however, that certain modifications would come within the teachings of this invention. Therefore, the following claims should be studied to determine the true scope and content of the invention.

Any numerical values recited in the above application include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes.

The term "consisting essentially of" to describe a combination shall include the elements, ingredients, components or steps identified, and such other elements ingredients, components or steps that do not materially affect the basic and novel characteristics of the combination.

The use of the terms "comprising" or "including" to describe combinations of elements, ingredients, components or steps herein also contemplates embodiments that consist essentially of the elements, ingredients, components or steps.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps. All references herein to elements or metals belonging to a certain Group refer to the Periodic Table of the Elements published and copyrighted by CRC Press, Inc., 1989. Any reference to the Group or Groups shall be to the Group or Groups as reflected in this Periodic Table of the Elements using the IUPAC system for numbering groups.

What is claimed is:

1. A photovoltaic device suitable for directly mounting on a structure comprising:
   an active portion including a photovoltaic cell assembly having a top surface portion that allows transmission of light energy to a photoactive portion of the photovoltaic device for conversion into electrical energy and a bottom surface having a bottom bonding zone; and
   an inactive portion immediately adjacent to and connected to the active portion, the inactive portion having a region for receiving a fastener to connect the device to the structure and having on a top surface, a top bonding zone;
   wherein one of the top and bottom bonding zones comprises a first bonding element and the other comprises a second bonding element, the second bonding element designed to interact with the first bonding element on a vertically overlapped adjacent photovoltaic device to bond the device to such adjacent device or to the structure;
   wherein the device has a thickness of more than 5 mm and less than 20 mm and exhibits a high stiffness of up to about 10,000 MPa, and the first bonding element comprises a pressure sensitive adhesive that maintains a minimum peel force of 3 pounds per linear inch at temperatures between $-40°$ C. and $85°$ C. and has an elongation of greater than 500%.

2. The device according to claim 1, wherein the first bonding element comprises an adhesive creating an adhesive bonding element and the second bonding element includes a compatible material for accepting at least a portion of the first bonding element.

3. The device according to claim 2, wherein the first bonding element further comprises a removable release liner disposed over an outer surface of the adhesive, which is removed to enable the first and second bonding elements or the first bonding element and the structure to form a bond.

4. The device according to claim 3, wherein the removable release liner extends laterally from a periphery of the photovoltaic device by at least 10 mm creating a laterally extended portion, and is folded back upon itself at least in one of the bonding zones.

5. The device according to claim 3, wherein the removable release liner covers a portion of the top surface portion of the active portion and is opaque or light limiting to prevent the cell from generating electricity until it is removed.

6. The device according to claim 3, wherein the removable release liner includes a print installation instruction for easy access for an installer.

7. The device according to claim 3, wherein the removable release liner includes an outer surface with slip protection.

8. The device according to claim 1, wherein the first bonding element is coextensive with or disposed within 25 mm of a peripheral edge of the active portion on the bottom surface of the active portion.

9. The device according to claim 1, wherein a portion of the top bonding zone, the bottom bonding zone, or both include a patterned surface that increases the surface area relative to a flat surface by more than 5%.

10. The device according to claim 1, wherein the first bonding element, the second bonding element, or both are configured as either a continuous element or a non-continuous element separated by a space.

11. The device according to claim 1, wherein the device has an increased thickness of the inactive portion at or near the edge opposite from the active portion.

12. The device according to claim 11, wherein the increase in the thickness is 0.5 to 15 mm.

13. The device according to claim 12, wherein the increase in the thickness is achieved by a component disposed about the edge of the inactive portion.

14. The device according to claim 1, wherein the pressure sensitive adhesive maintains a minimum peel force of 5 pounds per linear inch at temperatures between −40° C. and 85° C.

15. The device according to claim 1, wherein the inactive portion and the bottom surface portion of the active portion contain fillers.

16. The device according to claim 1, wherein the inactive portion and the bottom surface portion of the active portion comprise polymers.

17. A photovoltaic suitable for directly mounting on a structure comprising:
an active portion including a photovoltaic cell assembly having a top surface portion that allows transmission of light energy to a photoactive portion of the photovoltaic device for conversion into electrical energy and a bottom surface having a bottom bonding zone; and
an inactive portion immediately adjacent to and connected to the active portion, the inactive portion having a region for receiving a fastener to connect the device to the structure and having on a top surface, a top bonding zone;
wherein one of the top and bottom bonding zones comprises a first bonding element and the other comprises a second bonding element, the second bonding element designed to interact with the first bonding element on a vertically overlapped adjacent photovoltaic device to bond the device to such adjacent device or to the structure;
wherein the device has a thickness of more than 5 mm and less than 20 mm and exhibits a high stiffness of up to about 10,000 MPa, the second bonding element includes at least one recessed pocket for accepting at least a portion of the first bonding element, the first and second bonding elements comprises a hook and loop fastener assembly with an assembly thickness, and the hook and loop fastener assembly thickness is at least 90% disposed within the at least one recessed pocket.

18. The device according to claim 17, wherein the at least one recessed pocket has a pocket depth of at least 1.0 mm.

19. The device according to claim 17, wherein the device has an increased thickness of the inactive portion at or near the edge opposite from the active portion of 0.5 to 15 mm.

20. The device according to claim 17, wherein the inactive portion and the bottom surface portion of the active portion comprise polymers.

* * * * *